United States Patent
Korenari

(10) Patent No.: US 6,753,549 B2
(45) Date of Patent: Jun. 22, 2004

(54) THIN FILM TRANSISTOR

(75) Inventor: Takahiro Korenari, Yokohama (JP)

(73) Assignee: Kabushiki Kaisha Ekisho Sentan Gijutsu Kaihatsu Center, Yokohama (JP)

( * ) Notice: Subject to any disclaimer, the term of this patent is extended or adjusted under 35 U.S.C. 154(b) by 0 days.

(21) Appl. No.: 10/397,688

(22) Filed: Mar. 25, 2003

(65) Prior Publication Data

US 2003/0183857 A1 Oct. 2, 2003

(30) Foreign Application Priority Data

Mar. 29, 2002 (JP) ........................................ 2002-094665

(51) Int. Cl.[7] ...................... H01L 29/04; H01L 31/036; H01L 31/0376; H01L 31/20; H01L 29/76
(52) U.S. Cl. ......................................... 257/57; 257/66
(58) Field of Search ............................... 257/347, 352, 257/353, 354, 57, 66

(56) References Cited

U.S. PATENT DOCUMENTS

| | | | | |
|---|---|---|---|---|
| 4,546,376 A | * | 10/1985 | Nakata et al. | .............. 257/354 |
| 5,739,574 A | * | 4/1998 | Nakamura | .................. 257/401 |
| 6,184,556 B1 | * | 2/2001 | Yamazaki et al. | .......... 257/354 |
| 2001/0036710 A1 | * | 11/2001 | Hayashi et al. | ............. 438/439 |

* cited by examiner

*Primary Examiner*—Ngân V. Ngô
(74) *Attorney, Agent, or Firm*—Graybeal Jackson Haley LLP

(57) ABSTRACT

A thin film transistor capable of controlling the dispersion in its characteristic, which includes a glass base plate 2, an insulating foundation film 3 made of silicon dioxide ($SiO_2$) and formed on the glass base plate 2, a semiconductor layer 4 made of silicon (Si) formed on the insulating foundation film 3, a source region 8 and a drain region 9 which are formed on the semiconductor layer 4 to be separately located on both sides in the longitudinal direction of the semiconductor layer, a channel region 10 existing between the source region 8 and drain region 9, a gate insulating film 6 made of $SiO_2$ and formed on the channel region 10, and a gate electrode 7 formed on the gate insulating film 6, wherein the taper angle θ of the end portion 5 located in the width direction WD of the channel region 10 covered by at least the gate electrode 7 is 60° or more.

7 Claims, 7 Drawing Sheets

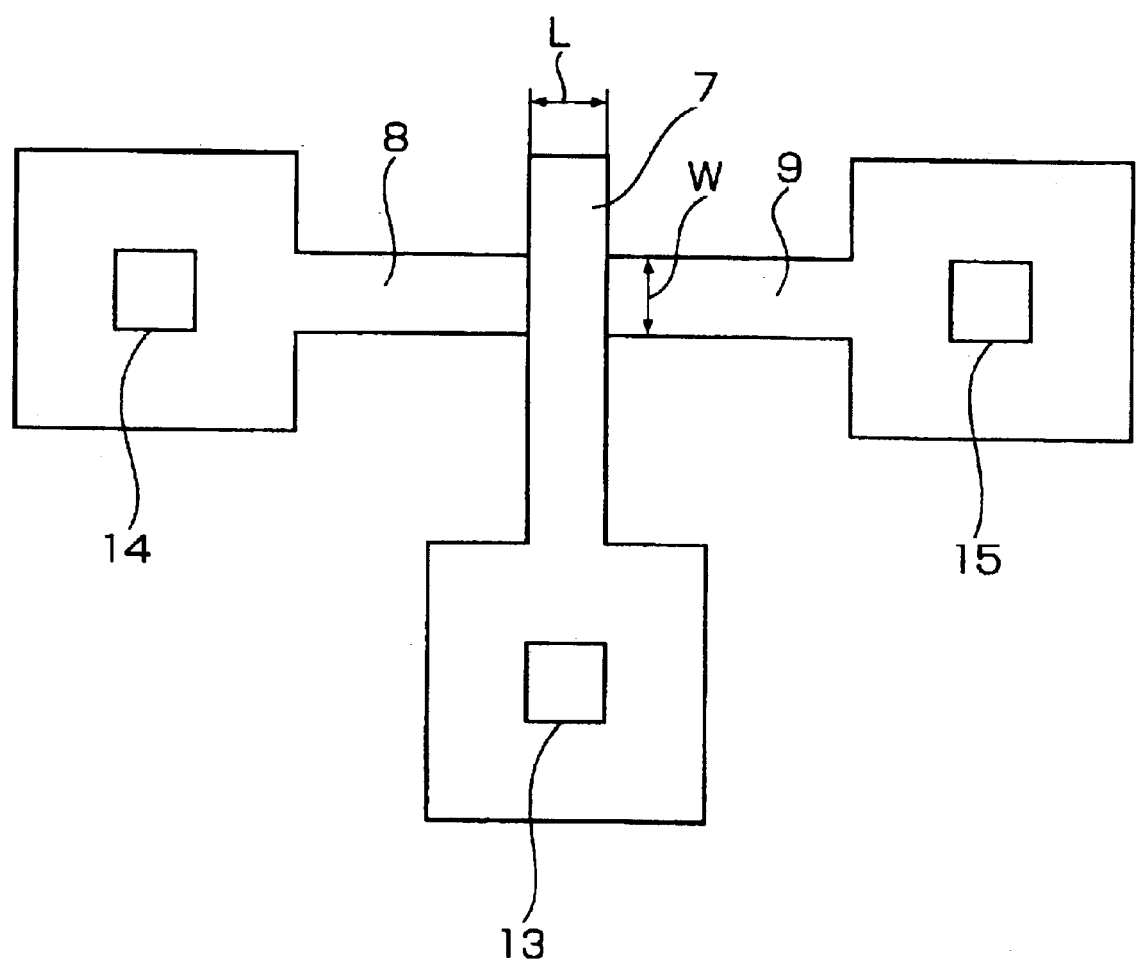

THIN FILM TRANSISTOR

CROSS-REFERENCE TO RELATED APPLICATION

Priority is claimed to Japanese patent application No. 2002-094665, filed Mar. 29, 2002, which is incorporated by reference.

BACKGROUND OF THE INVENTION

1. Field of the Invention

The present invention relates to a thin film transistor and, more particularly, to a thin film transistor for use in a liquid crystal display device and others.

2. Prior Art

FIG. 7(a) is a perspective view indicating a prior art thin film transistor while FIG. 7(b) is a sectional view taken on line A–A' of FIG. 7(a).

In FIG. 7(a), a reference numeral 1 indicates a thin film transistor, 2 a glass base plate, 3 an insulating foundation film made of silicon dioxide ($SiO_2$) and others, 4 a semiconductor layer made of silicon (Si) for instance, 5 end portions located in the channel width direction of the semiconductor layer 4, 6 a gate insulating film made of silicon dioxide and others, 7 a gate electrode, 8 a source region, 9 a drain region, 10 a channel region, L a channel length, W a channel width, and WD a width direction of the channel region. In FIG. 7(b), a reference sign θ designates a taper angle (i.e. a tilt angle θ made by the hypotenuse and the horizontal side of the approximately right-angled triangular end portion) of the end portion 5 of the semiconductor layer 4.

FIGS. 7(a) and 7(b) show the thin film transistor in which the semiconductor layer 4 is formed on the insulating foundation film 3 lying on the glass base plate 2, and the gate electrode 7 is formed on the gate insulating film 6 as formed to cover the semiconductor layer 4.

The thin film transistor having the gate electrode 7 above the semiconductor layer 4 as mentioned above is called a thin film transistor of the top-gate type.

In case of the top-gate type thin film transistor 1 as shown in FIGS. 7(a) and 7(b), if forming it for instance by using the semiconductor layer 4 made of silicon, due to the forming process of it, to put it concretely, the process of forming the semiconductor layer 4 in a predetermined pattern by etching it by means of the photolithographic method, both end portions 5 located in the channel width direction of the semiconductor layer 4 have a tapered shape, that is, a certain taper angle θ as shown in FIG. 7(b).

This taper angle θ sometime varies depending on the location of the end portion on the glass base plate, due to the forming process as mentioned above. However, it is true that this variation in the taper angle θ is a very important factor causing variation in the characteristic of the thin film transistor 1.

As far as the channel width (or gate width) W is sufficiently wide, contribution of the end portion 5 (called gate edge portion) located in the channel region of the semiconductor layer 4 covered by the gate electrode 7 is relatively small, so that the variation of the taper angle θ does not cause a significant problem.

However, if the channel width W becomes very small, for instance 1 μm or less, the issue that the characteristic of the thin film transistor 1 is dispersed due to the variation in the taper angle θ appears before us as a problem to be considered and solve. Especially, in case of a glass base plate 2 having a large dimension for a liquid crystal display device use, this problem becomes more serious and significant.

Now, let us assume the thin film transistor 1 as shown in FIGS. 7(a) and 7(b) of which each part has a dimension as follows: the channel width W being 1 μm; a channel length L being 4 μm; the film thickness of the gate insulating film 6 being 40 nm; and the film thickness of the semiconductor layer being 60 nm.

A three-dimensional device simulation is executed with regard to the thin film transistor having the structure as mentioned above. FIGS. 6(a) and 6(b) are graphs showing results obtained by computing the data having been obtained from the three-dimensional device simulation. In the figures, FIG. 6(a) shows a relation of Normalized Drain Current vs Gate Voltage ($l_d$-$l_g$ characteristic) at taper angles of 30°, 45° and 60° while FIG. 6(b) indicates the relation of Threshold Voltage vs Taper angle showing how the above taper angle θ gives influence to the threshold voltage $V_{th}$. In FIG. 6(a), the drain voltage $V_d$ is 5V.

As will be clearly seen from these results, the $l_d$-$V_g$ characteristic is remarkably changed by the taper angle θ and the threshold voltage $V_{th}$ is also changed by the taper angle θ. In short, this indicates that if the taper angle θ is changed in the process of manufacturing the thin film transistor, the threshold voltage $V_{th}$ is changed. As will be apparent from FIG. 6(b), the threshold voltage $V_{th}$ comes to indicate a considerably big change if the taper angle θ is in the range of 60° or less while the change in the threshold voltage $V_{th}$ becomes very small if the taper angle θ is in the range of more than 60°. From this, it will be understood how important the control of the taper angle θ is.

Accordingly, an object of the invention is to provide a thin film transistor capable of controlling the dispersion in its characteristic, which is caused by the variation in the taper angle θ at the end portion located in the channel width direction of the semiconductor layer.

SUMMARY OF THE INVENTION

In order to solve the problems as described above, the invention takes constitutions as recited in the scope of claim for patent attached to this specification.

That is, a thin film transistor as recited in claim 1 includes a semiconductor layer formed on a base substrate, a source region and a drain region formed on the semiconductor layer to be separately located on both sides in the longitudinal direction of the semiconductor layer, a channel region located between the source region and the drain region, and a gate electrode formed on a gate insulating film lying on the channel region, wherein the taper angle θ of each of end portions located in the channel width direction in the channel region covered by at least the gate electrode is 60° or more.

Furthermore, a thin film transistor as recited in claim 2 includes a semiconductor layer formed on a base plate, a source region and a drain region formed on the semiconductor layer to be separately located on both sides in the longitudinal direction of the semiconductor layer, a channel region located between the source region and the drain region, and a gate electrode formed on a gate insulating film lying on the channel region, wherein each of end portions located in the channel width direction in the channel region covered by at least the gate electrode is insulated.

Still further, a thin film transistor as recited in claim 3 includes a semiconductor layer formed on a base plate, a source region and a drain region formed on the semiconductor layer to be separately located on both sides in the longitudinal direction of semiconductor layer, a channel region located between the source region and the drain region, and a gate electrode formed on a gate insulating film lying on the channel region, wherein an impurity having a conductive type opposite to that which is introduced into the source region and the drain region as well, is introduced into the end portion located in the channel width direction in the channel region at least covered by at least the gate electrode.

A thin film transistor according to the invention will now be described in detail by way of several embodiments thereof with reference to the accompanying drawings in which constituents of the invention having like function are designated by like reference numerals and signs, and repetitive description thereof will be omitted for simplification.

BRIEF DESCRIPTION OF THE DRAWINGS

In the drawings:

FIG. 1(a) is a perspective view of a thin film transistor according to the first embodiment of the invention while

FIG. 2 is a diagram showing a layout in a thin film transistor according to the first embodiment of the invention.

FIG. 3(a) is a sectional view showing a main part of a thin film transistor according to the second embodiment of the invention while

FIG. 4(a) is a sectional view showing a main part of a thin film transistor according to the third embodiment of the invention while

FIG. 6(a) is a graph showing a relation between the gate voltage and the drain current at the taper angles of 30°, 45° and 60° while

FIG. 7(a) is a perspective view of a prior art thin film transistor according to the first embodiment of the invention while

DETAILED DESCRIPTION OF THE PREFERRED EMBODIMENTS (First Embodiment)

Figure 1A:
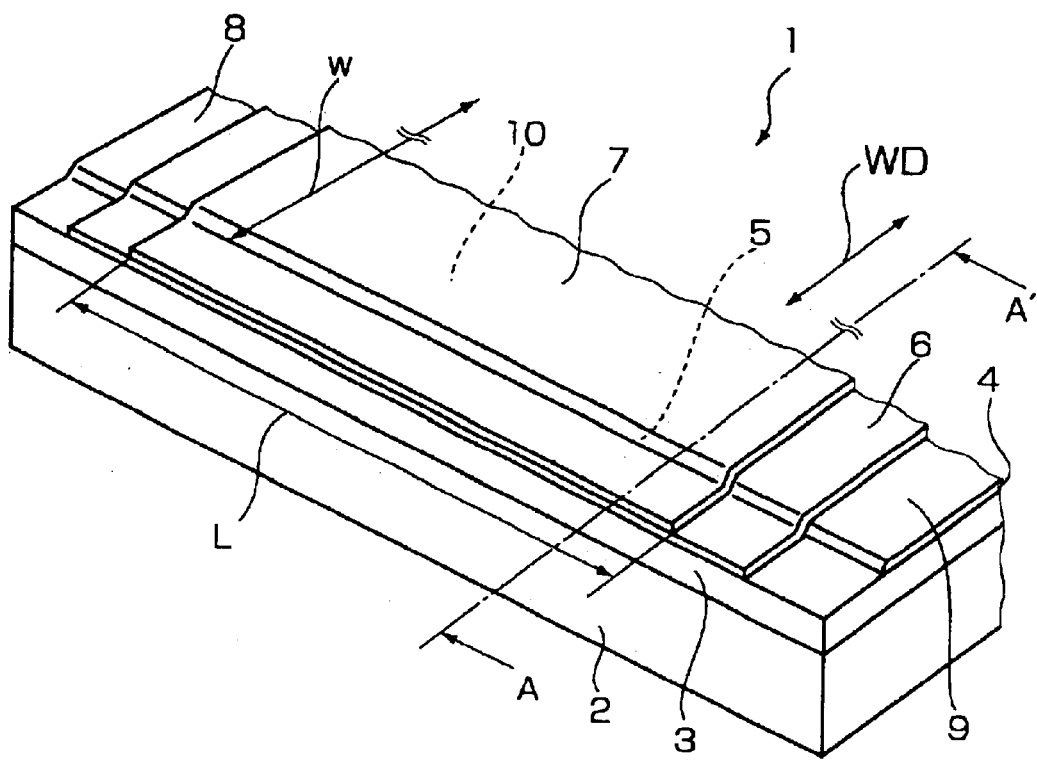
Figure 1B:
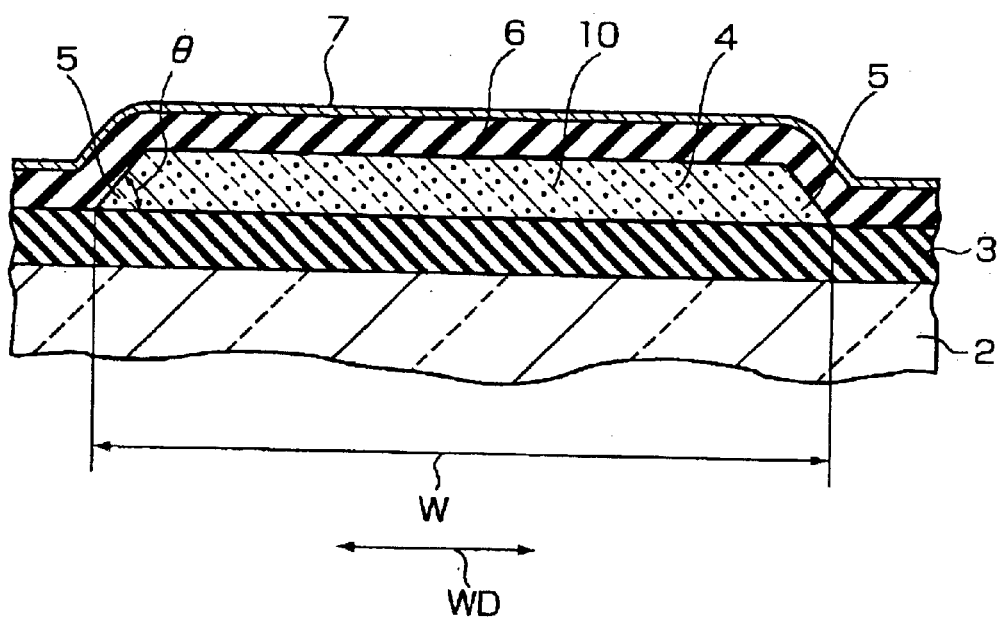
FIG. 1(b) is a sectional view taken on line A–A' in FIG. 1(a).

FIG. 1(a) is a perspective view of a thin film transistor according to the first embodiment of the invention while FIG. 1(b) is a sectional view taken on line A–A' in FIG. 1(a). FIG. 2 is a diagram showing a layout in a thin film transistor according to the first embodiment of the invention.

Figure 7A:
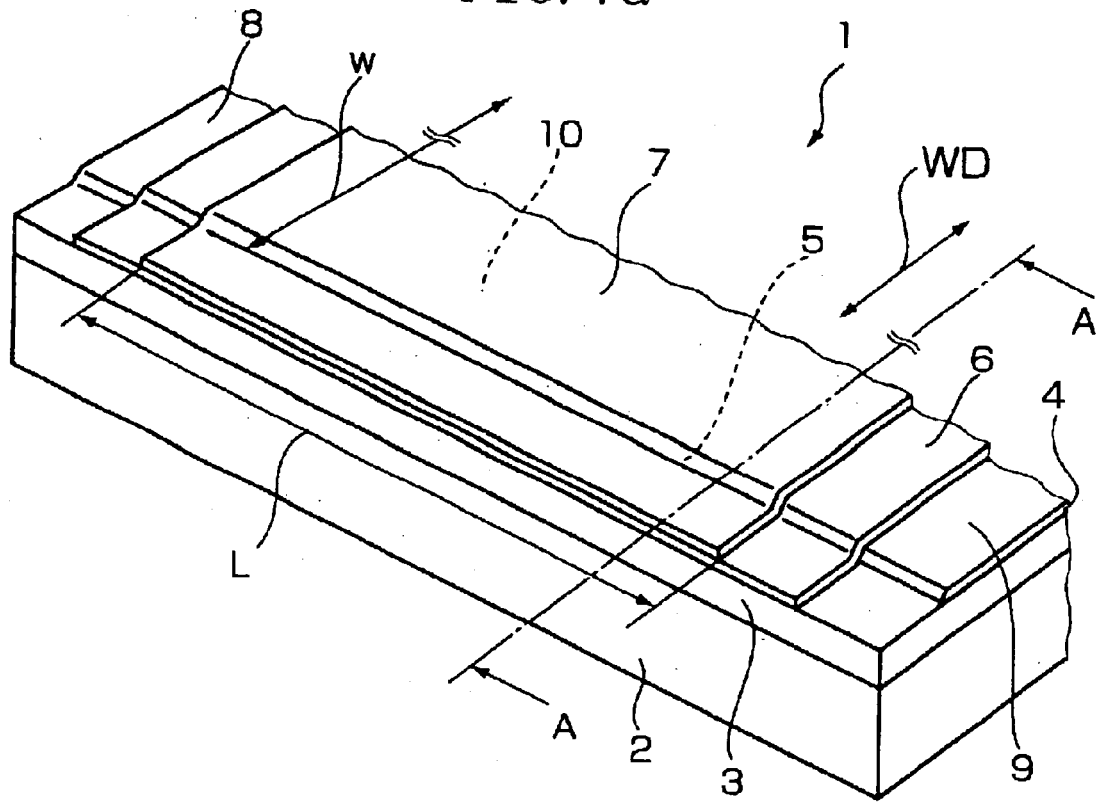
Figure 7B:
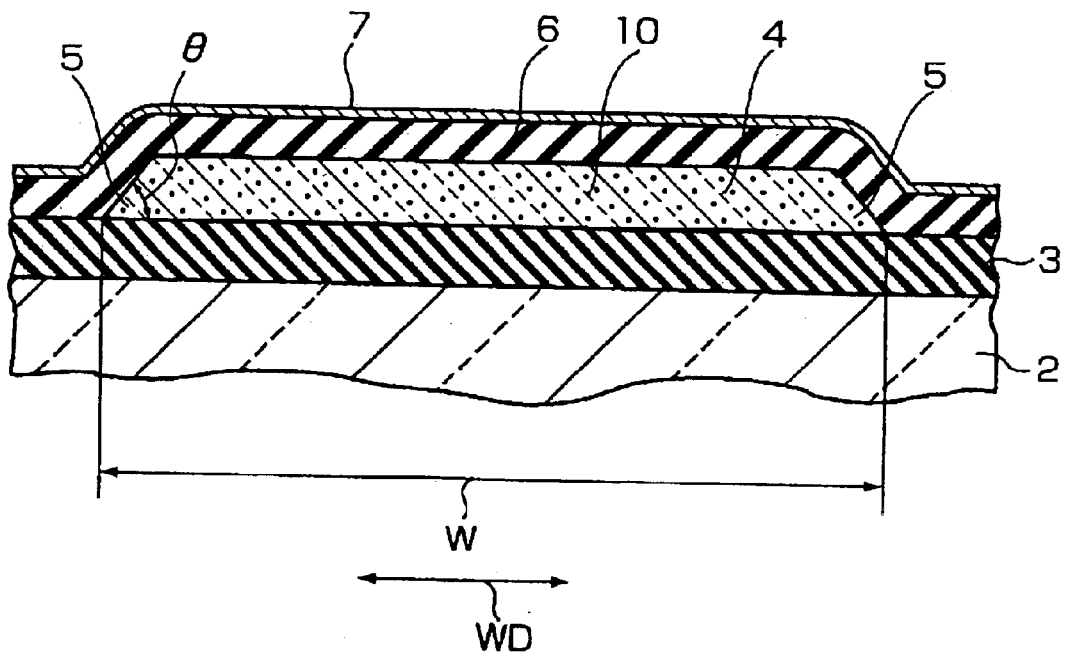
FIG. 7(b) is a sectional view taken on line A–A' in FIG. 7(b).

In the following description, a part designated by the same reference numeral or sign as that used in FIGS. 7(a) and 7(b) indicates an identical part, thus the description thereabout being omitted.

In FIG. 2, each of reference numerals 13, 14 and 15 indicates a contact hole for each of the gate electrode 7, the source region 8 and the drain region 9.

A thin film transistor 1 according to the first embodiment of the invention includes a glass base plate 2; an insulating foundation film 3 made of $SiO_2$ film and others and formed on the glass base plate 2; a semiconductor layer 4 made of polycrystalline silicon or amorphous silicon and formed on the insulating foundation film 3; a source region 8 and a drain region 9 which are formed by introducing impurities into both sides of the semiconductor layer 4; a channel region 10 existing between the source region 8 and drain region 9; a gate insulating film 6 made of $SiO_2$ film and others and formed on the channel region 10; and a gate electrode 7 formed on the gate insulating film 6. In this thin film transistor 1, the taper angle θ of the end portion 5 located in the width direction WD of the channel region 10 covered by at least the gate electrode 7 is made 60° or more. (corres. to claim 1).

As described above, according to the first embodiment of the invention, the semiconductor layer 4 is made of silicon while the insulating foundation film 3 and the gate insulating film 6 are made of silicon dioxide ($SiO_2$). The semiconductor layer 4 and the boundary face thereof include certain defects due to impurities and incompleteness in the crystal. In this structure, the end portion 5 located in the channel width direction WD of the semiconductor layer 4 has a taper angle of 60° or more.

In case of the n-channel thin film transistor 1, phosphorus is implanted (doped) in both of the source region 8 and the drain region 9 at a volume density of $1 \times 10^{20}$ cm$^{-3}$ while boron is implanted (doped) in the channel region 10 at a volume density of $1 \times 10^{16}$ cm$^{-3}$. The gate insulating film 6 covering the semiconductor layer 4 is formed by a conformal model. The channel W is 1 μm, the channel length L is 4 μm, the film thickness of the gate insulating film 6 is 40 nm, and the film thickness of the semiconductor layer 4 is 60 nm. The film thickness of the gate electrode 7 is set to be 300 nm in the range of 200 nm~500 nm.

As described before, the characteristic dispersion problem in the thin film transistor is caused by the dispersion in the taper angle θ of the end portion 5 located in the channel width direction WD of the semiconductor layer 4. Accordingly, one solution of this problem is to set the taper angle θ of the end portion 5 located in the channel width direction WD of the semiconductor layer 4 to be 60° or more based on the result as shown in FIG. 6. In other words, the solution is to control the manufacturing process condition (i.e. etching condition) of the semiconductor layer 4 such that an average taper angle θ of the end portion 5 becomes 60° or more. That is, in general, the taper angle θ of the end portion 5 is influenced by the cross sectional profile of the patterned photo-resist layer (i.e. resist profile, being dependent on the property of the photo-resist such as ability of holding a designed pattern, sensitivity to the light exposure and so forth). In short, the taper angle θ of the end portion 5 can be controlled by controlling the resist profile, to put it more concretely, by using a more sensitive photo-resist, optimizing the light exposure condition, optimizing the baking condition at the time of light exposure and so forth.

Figure 6A:
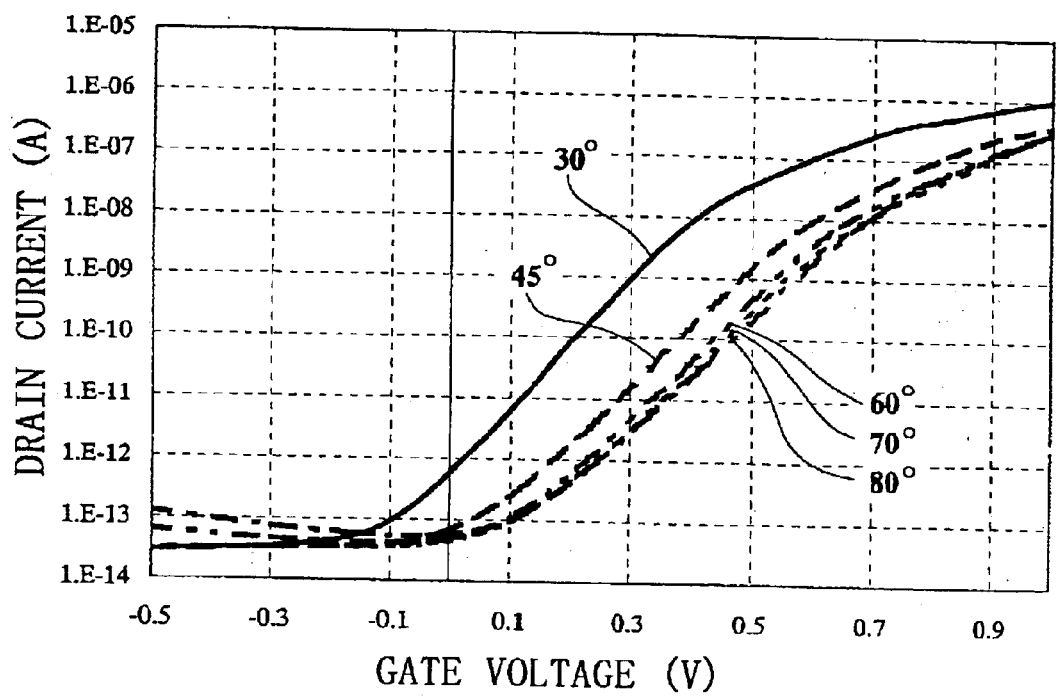
Figure 6B:
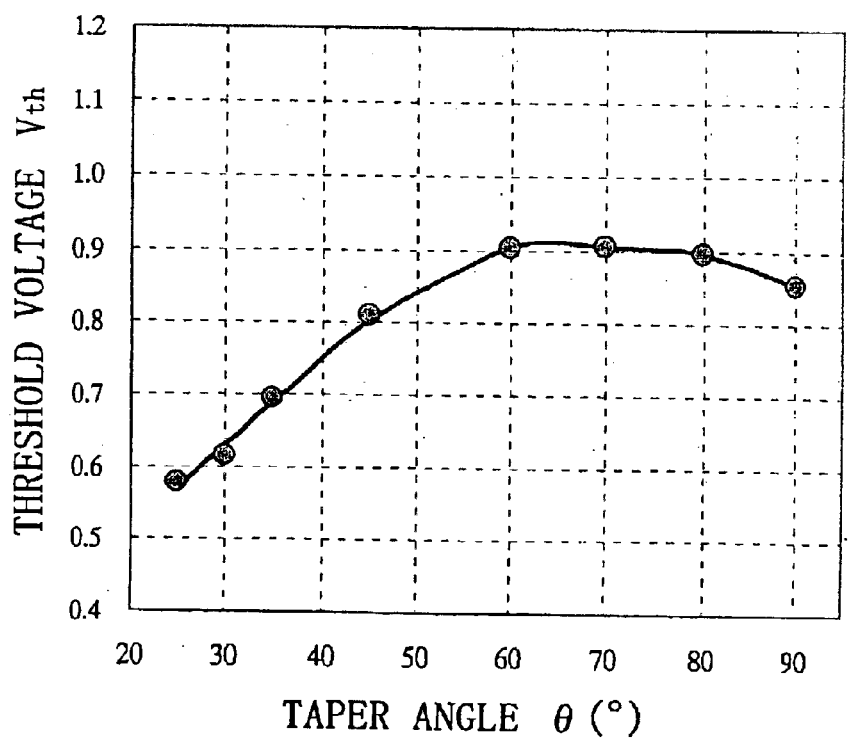
FIG. 6(b) is a graph indicating a relation between the taper angle θ and the threshold voltage $V_{th}$.

As will be seen from the result shown in FIGS. 6(a) and 6(b), if the average value of the taper angle θ is set to be 60° or more, the fluctuation of the threshold voltage $V_{th}$ can be controlled even though the taper angle θ is varied. As a result, variation of the taper angle θ can be permitted to some extent, thus improving the manufacturing yields.

(Second Embodiment)

Figure 3A:
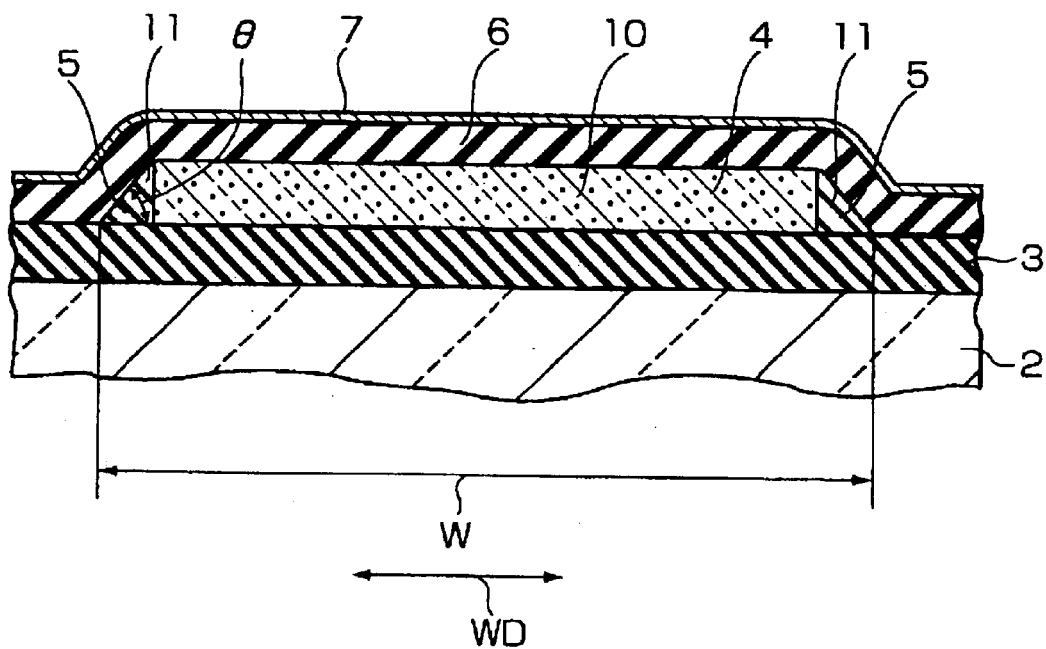
Figure 3B:
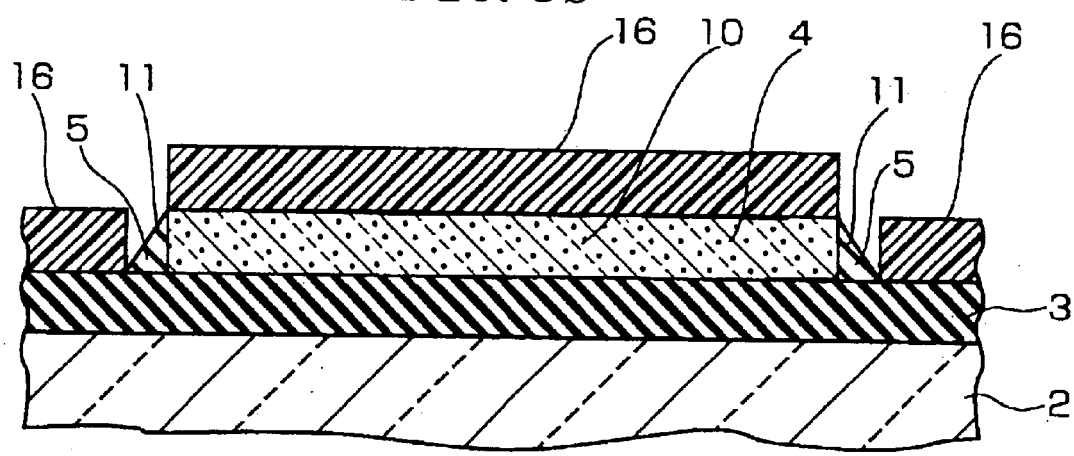
FIG. 3(b) is a sectional view indicating a method of manufacturing the above main part.

FIG. 3(a) is a sectional view showing a main part of a thin film transistor according to the second embodiment of the invention (corres. to FIG. 1(b) of the first embodiment). FIG. 3(b) is a sectional view indicating a method of manufacturing the above main part.

In FIGS. 3(a) and 3(b), a reference numeral 11 indicates an insulating film made of silicon dioxide ($SiO_2$) while a reference numeral 16 in FIG. 3(b) indicates a photo resist film.

As will be seen form the before-mentioned, it is apparent that a cause of changing the threshold voltage $V_{th}$ exists in the structure of the end portion 5 (gate edge portion) located in the channel width direction WD in the channel region 10 of the semiconductor layer 4 covered by the gate electrode 7. Accordingly, the countermeasure for obviating this cause is to prevent any electric current from flowing through the end portion 5.

In the second embodiment, therefore, in order to realize this countermeasure, the end portion 5 located in the channel width direction WD of the channel region 10 at least covered by the gate electrode 7 is converted into an insulator or the like by forming an insulating film 11 and so on as shown in FIG. 3(a) (corres. to claim 2).

There would be several methods of selectively isolating the end portion 5 of the semiconductor layer 4 by converting it into an insulator, for instance, a method wherein after forming the semiconductor layer 4 and giving it a predetermined shape and pattern, all the regions of the semiconductor 4 are covered by the photo resist film 16 except the end portions 5 and then, the semiconductor 4 covered by the photo resist 16 is exposed to the oxidation atmosphere or treated by the plasma oxidation and others, thereby only the end portion 5 being selectively oxidized.

With this, as the end portion 5 comes to reject any electric current going to pass through it, it becomes possible to make such a structure that the end portion 5 can have no contribution to the threshold voltage $V_{th}$. Consequently, even though the taper angle θ of the end portion 5 is varied, the structure in which the taper angle θ is 90° in effect can be obtained and the variation in the threshold voltage $V_{th}$ can be controlled.

In the first embodiment, however, as the taper angle θ of the end portion 5 of the semiconductor layer 4 becomes larger, there is a possibility of inviting a disadvantageous situation, for instance discontinuation of the gate insulating film 6 covering the semiconductor layer 4 caused by cut-off of the insulating film 6 at the sharp corner of the stepped portion, decrease in the breakdown voltage of the insulating film 6 and so forth. To the contrary, in the second embodiment, the taper angle θ of the end portion 5 of the semiconductor layer 4 is not made larger and is selectively insulated, thus such problems as described above being obviated.

(Third Embodiment)

Figure 4A:
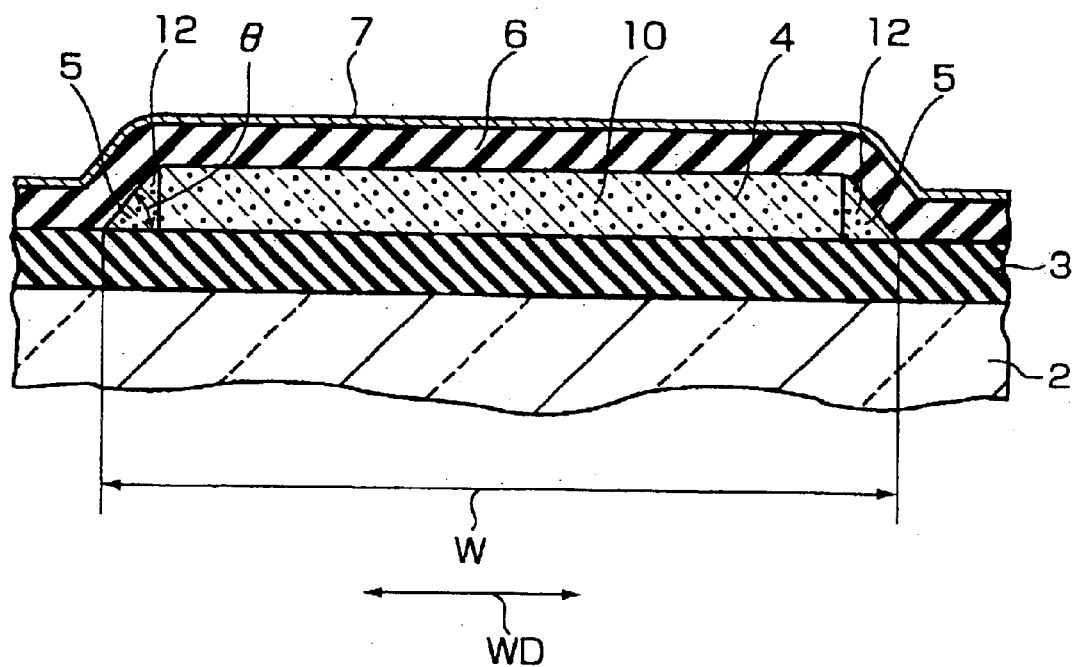
Figure 4B:
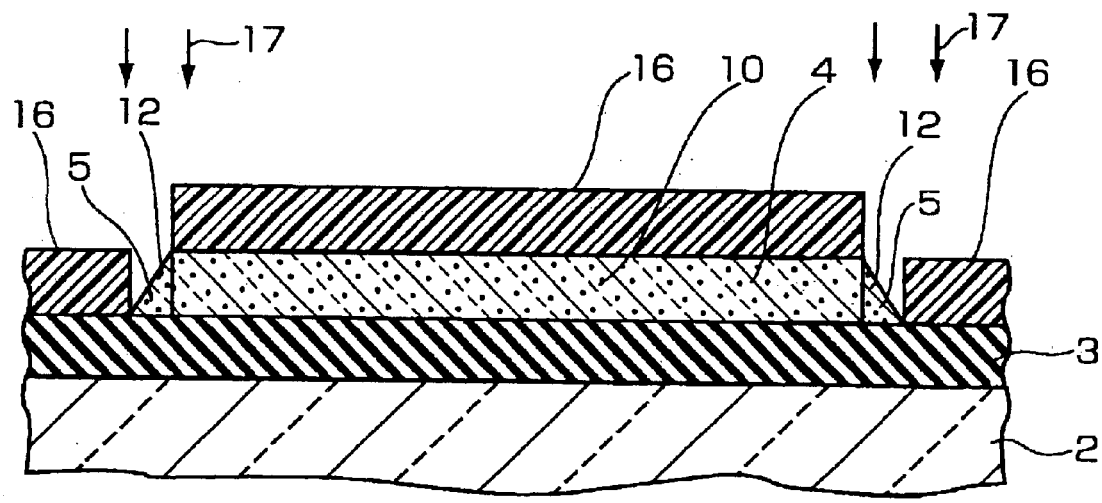
FIG. 4(b) is a sectional view indicating a method of manufacturing the above main part.

FIG. 4(a) is a sectional view showing a main part of a thin film transistor according to the third embodiment of the invention (corres. to FIG. 1(b) of the first embodiment), and FIG. 4(b) is a sectional view indicating a method of manufacturing the above main part.

In FIGS. 4(a) and 4(b), a reference numeral 12 indicates an impurity region to which an impurity is selectively introduced, and in FIG. 4(b), a reference numeral 17 indicates the impurity.

In the second embodiment as described above, there has been presented a countermeasure for forming such a structure that the end portion 5 located in the channel width direction of the semiconductor layer 5 has no contribution to the threshold voltage $V_{th}$. In the third embodiment, there will be presented the other countermeasure different from the one presented in the second embodiment. That is, in the countermeasure according to the third embodiment, an impurity having a conductive type opposite to that which is introduced into the source region 8 and the drain region 9 as well, is introduced into the end portion 5 located in the channel width direction WD of the channel region at least covered by the gate electrode 7, (corres. to claim 3).

There would be several methods of selectively introducing the impurity into the end portion 5 of the semiconductor layer 4, for instance, for instance a method as shown in FIG. 4(b) wherein after forming the semiconductor layer 4 and giving it a predetermined shape and pattern, all the regions of the semiconductor 4 are covered by the photo resist film 16 except the end portions 5 and then, a predetermined impurity is introduced into the end portion 5 by means of the publicly known method.

With the introduction of the impurity into the end portion 5 like this, the threshold voltage $V_{th}$ for a channel to be formed in the end portion 5 becomes larger. Basically, if the impurity of the n- or p-type has been already introduced into the entirety of the channel region 10 at an impurity density of c, the object of the third embodiment can be achieved by introducing the impurity of the identical conductive type into the end portion 5 of the channel region 10 at an impurity density higher than the impurity density of c. As an impurity, for instance, boron is used for the n-type thin film transistor while phosphorus is used for the p-type thin film transistor. With regard to the impurity density in the third embodiment, it is set to be $10^{17}$ cm$^{-3}$ for the channel region 10 while $10^{19}$ cm$^{-3}$ for the impurity region of the end portion 5.

With the structure like this, the threshold voltage $V_{th}$ in the end portion (gate edge portion) 5 located in the channel width direction of the channel region 10 covered by the gate electrode 7 is made larger, thereby the channel formation by the electric field of the gate electrode 7 being suppressed. With this, even though the taper angle θ of the end portion 5 is varied, the structure in which the taper angle θ is 90° in effect can be obtained and the variation in the threshold voltage $V_{th}$ can be controlled.

The structure of the thin film transistor according to the embodiments 2 and 3 of the invention is equivalent, in terms of the electric characteristic, to the structure in which the taper angle θ of the end portion 5 of the semiconductor layer 4 is 90° and also equivalent in terms of realizable effect to the structure in which the taper angle θ is 90°.

Similar to the second embodiment, also in the third embodiment, as the taper angle θ of the end portion 5 of the semiconductor layer 4 is not made large and the end portion 5 is selectively given the impurity of high density, problems such as discontinuation of the gate insulating film 6 covering the semiconductor layer 4, which is caused by cut-off of the insulating film 6 at the sharp corner of the stepped portion, decrease in the breakdown voltage of the insulating film 6 and so forth can be obviated.

Figure 5:
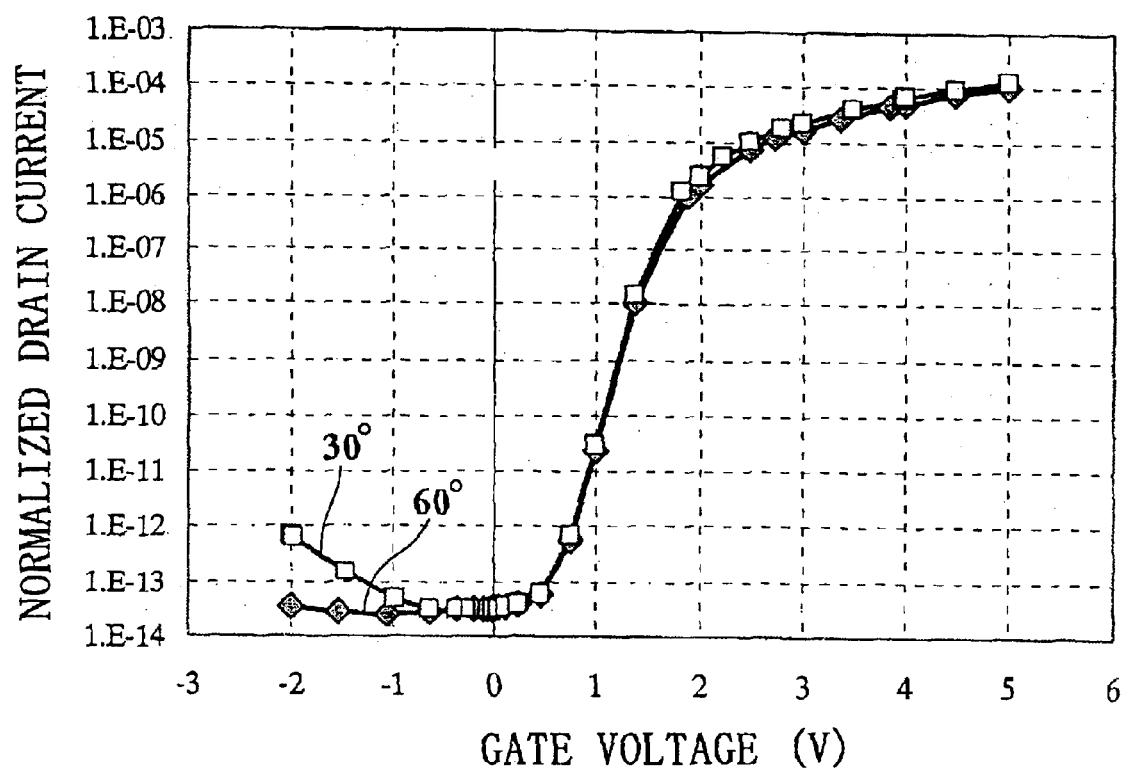
FIG. 5 is a graph showing a relation between the gate voltage and the drain current in a thin film transistor according to the third embodiment of the invention.

The effect obtained by the thin film transistor as realized according to the third embodiment is computed by means of the three-dimensional device simulation. FIG. 5 is a graph showing a relation between the gate voltage and the drain current when forming the above-mentioned impurity region 12 in the end portion 5. In this case, the end portion 5 of the semiconductor layer 4 is formed to have the taper angle θ of 30° and 60°. From this computation results, it will be understood that the change of the threshold voltage $V_{th}$ is made small when the taper angle θ is 30° and 60° and it becomes possible to control the change of the threshold voltage $V_{th}$ taking place along with the change of the taper angle θ of the end portion 5.

While some embodiments of the invention have been concretely shown and described in the above with reference to the accompanying drawings, the invention is not limited to such embodiments. Various changes and modifications will be possible without departing from the gist of the invention.

As has been explained so far, according to the invention, there is provided a thin film transistor capable of controlling the dispersion in the characteristic thereof, thus improving the manufacturing yields.

What is claimed is:

1. A thin film transistor comprising:
   a polycrystal or amorphous semiconductor layer formed on a substrate by etching and having a taper portion;
   a source region and a drain region formed in said polycrystal or amorphous semiconductor layer to be separately located on both sides in said semiconductor layer;
   a channel region located between said source region and said drain region, said channel region having a width of 1 μm or less; and
   a gate electrode formed on a gate insulating film lying on said channel region;
   wherein the taper angle of said taper portion located in the channel width direction in said channel region is about 60° or more.

2. A thin film transistor comprising:
   a polycrystal or amorphous semiconductor layer formed on a substrate by etching and having a taper portion;
   a source region and a drain region formed in said polycrystal or amorphous semiconductor layer to be separately located on both sides in said semiconductor layer;
   a channel region located between said source region and said drain region, said channel region having a width of 1 μm or less;
   a gate electrode formed on a gate insulating film lying on said channel region; and an insulated portion where said taper portion located in the channel width direction in said channel region is insulated.

3. A thin film transistor comprising:
   a polycrystal or amorphous semiconductor layer formed on a substrate by etching and having a taper portion;
   a source region and a drain region formed in said polycrystal or amorphous semiconductor layer to be separately located on both sides in said semiconductor layer;
   a channel region located between said source region and said drain region, said channel region having a width of 1 μm or less;
   a gate electrode formed on a gate insulating film lying on said channel region; and
   an impurity region where impurities are introduced in said taper portion in the channel width direction of said channel region.

4. A thin film transistor according to claim 1 wherein said substrate is a glass substrate.

5. A thin film transistor according to claim 2 wherein said substrate is a glass substrate.

6. A thin film transistor according to claim 3 wherein said substrate is a glass substrate.

7. A thin film transistor according to claim 3 wherein said impurity region is a high-concentration impurity region.

* * * * *